June 11, 1968 — J. L. ROOF ET AL — 3,388,346

SEMICONDUCTOR MULTIVIBRATOR PULSE TRAIN GENERATING CIRCUIT

Filed May 18, 1965 — 3 Sheets-Sheet 1

WITNESSES:
Bernard R. Gieguer
James F. Young

INVENTORS
James L. Roof and
Paul Knauer.
BY E. F. Possessky
ATTORNEY

United States Patent Office 3,388,346
Patented June 11, 1968

3,388,346
SEMICONDUCTOR MULTIVIBRATOR PULSE TRAIN GENERATING CIRCUIT

James L. Roof, Fort Shawnee, Lima, and Paul Knauer, Lima, Ohio, assignors to Westinghouse Electric Corporation, Pittsburgh, Pa., a corporation of Pennsylvania
Filed May 18, 1965, Ser. No. 456,680
7 Claims. (Cl. 331—111)

ABSTRACT OF THE DISCLOSURE

A circuit for generating pulse trains, especially where a short on time and a long off time are desired. The circuit includes multivibrator means with separate timing circuits for switching the multivibrator means between stable states to obtain output pulses with independently adjusted on and off times.

The present invention relates to circuits for generating pulse trains and more particularly to semiconductor multivibrator circuitry adapted for generating pulse trains having a relatively short on time and a relatively long off time.

A train of pulses having widely differing on and off times can be used for various control or other purposes. As one example application, a fuel valve motor in a thermoelectric heater-generator system may require energization for a period of several seconds every four or five minutes. A pulse train having a short on time and a long off time can thus be used to control the energization of the fuel valve motor. Although a motor driven cam arrangement or a time relay system can be used for generating a pulse train of this type, considerations of flexibility in timing design and long term maintenance free operating life make semiconductor circuitry a more desirable pulse train source.

In accordance with the principles of the present invention, a pulse train generating circuit comprises semiconductor bistable multivibrator circuit means energized from a suitable DC voltage source. A pair of timing circuits are arranged to switch the multivibrator circuit means between stable states with fast switching time. An output circuit is connected to the multivibrator circuit means, and the circuit timing can be set to produce variously characterized output pulse trains but preferably is set to produce a train of output pulses having a relatively short on time and a relatively long off time. Overall circuit operation is stable even with relatively wide variation in the voltage level of the voltage source.

It is therefore an object of the invention to provide a novel semiconductor multivibrator circuit which produces a train of pulses reliably and efficiently.

Another object of the invention is to provide a novel semiconductor multivibrator circuit which generates a train of pulses in which the on time is relatively short and the off time is relatively long.

An additional object of the invention is to provide a novel semiconductor multivibrator circuit which generates a train of pulses having a fast rise time and a fast fall time.

A further object of the invention is to provide a novel semiconductor multivibrator circuit which generates a pulse train with operating stability and without critical voltage level requirements.

It is another object of the invention to provide a novel semiconductor multivibrator circuit which generates a train of pulses and which is readily adjusted or varied to produce various on and off times for the pulse train.

These and other objects of the invention will become more apparent upon consideration of the following detailed description along with the attached drawings, in which.

Figure 1:
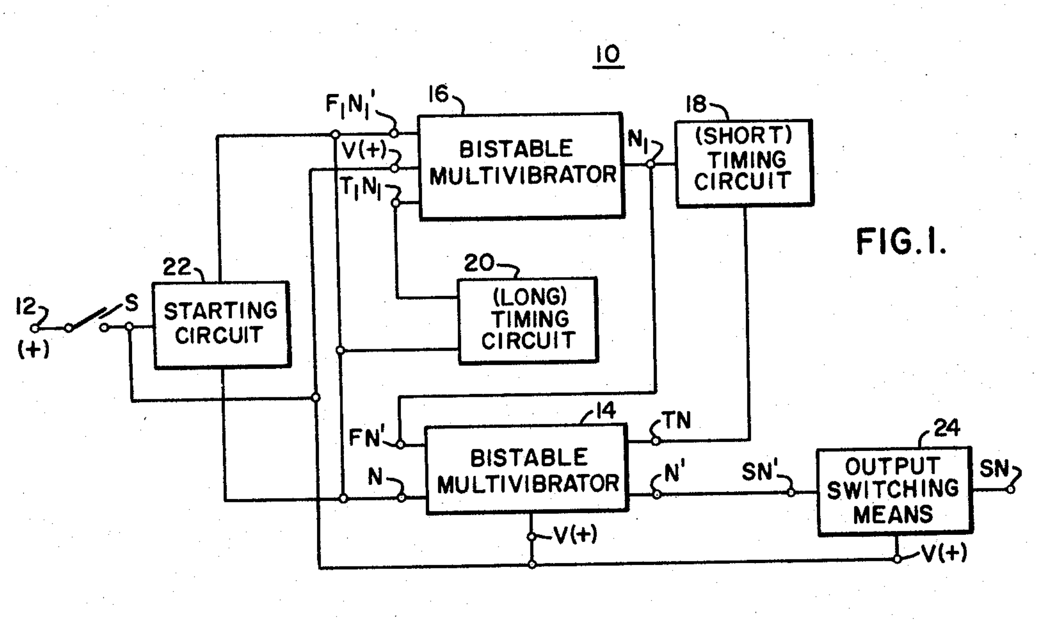
FIGURE 1 is a block diagram view of a semiconductor multivibrator circuit arranged to generate a pulse train in accordance with the principles of the invention.

More specifically, there is shown in FIG. 1 a semiconductor multivibrator pulse generating circuit 10 arranged in accordance with the principles of the invention for use in a wide variety of applications but preferably adapted for uses in which the pulse train is required to have a short on time and a long off time. If desired, the circuit 10 can be miniaturized by partly or totally forming it as a molecular solid state structure or as a thin-film unit. In this case, it is preferred that the circuit 10 be formed from conventional components.

The pulse generating circuit 10 is energized from a suitable DC source 12 through a switch S, and it comprises a pair of semiconductor bistable multivibrators 14 and 16 cross-connected by a pair of timing circuits 18 and 20 and energized by the source 12 through terminal V. When the multivibrator 14 is pulsed at an on terminal N, it is driven to its "on" state to start the timing circuit 18 through a terminal TN. After a relatively short period of time, the timing circuit 18 discharges to switch the multivibrator 14 to its "off" state through an off terminal FN' and to switch the multivibrator 16 to its "on" state through an on terminal $N_1$.

While the multivibrator 16 is in its "on" state, the timing circuit 20 is energized through a multivibrator terminal $T_1$ and $N_1$. After a relatively long period of time, the timing circuit 12 switches the multivibrator 16 to its "off" state, through an off terminal $F_1$ $N_1'$, and switches the multivibrator 14 on again through the on terminal N. The multivibrators 14 and 16 thus cycle between "on" and "off" states as long as the circuit 10 is energized. The descriptors "on" and "off" used for the multivibrator states are employed only for reference convenience and by "on" it is meant to refer to the state in which the multivibrator 14 or 16 energizes its associated timing circuit 18 or 20.

A starting circuit 22 is connected bewteen the source 12 and the multivibrators 14 and 16 to assure a proper vibratory mode of operation. Output switching means 24 is connected through an input terminal SN' to a terminal N' of the multivibrator 14. The terminal N' is a logical complement of the terminal N and accordingly produces an output when the multivibrator 14 is off. However, the output switching means 24 produces output pulses at a terminal SN from a voltage source terminal V over time periods corresponding to the time periods during which the multivibrator 14 is on.

Figure 2:
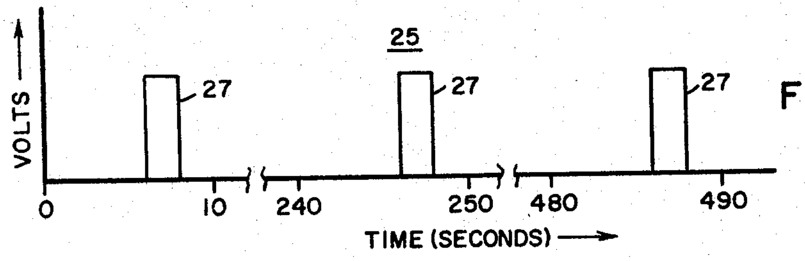
FIG. 2 shows an exemplary waveform generated by the circuit of FIG. 1.

A pulse train 25 (FIG. 2) is thus produced by the output switching means 24, and it comprises a plurality of pulses 27. As already indicated, the circuit timing is preferably set to produce a relatively short on time and a relatively long off time for the pulse train 25 as observed generally by reference to the time scale in FIG. 2.

Figure 3:
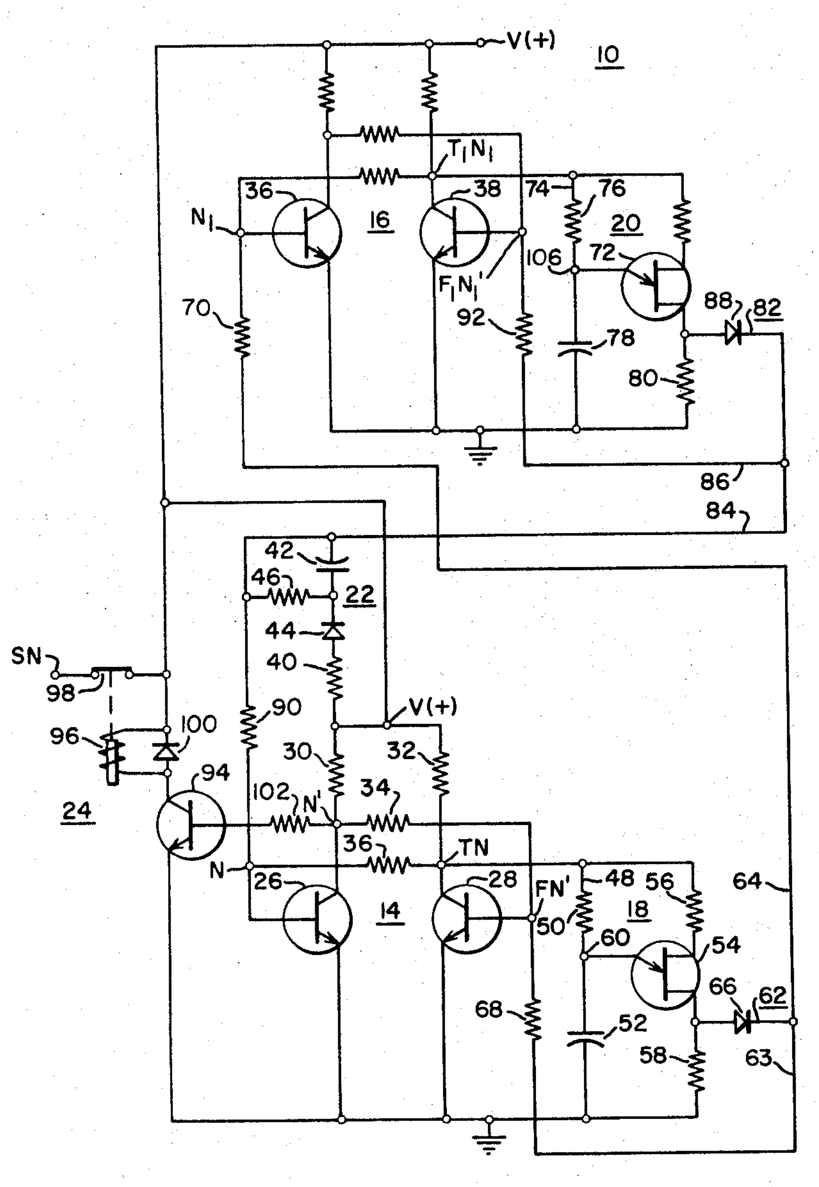
FIG. 3 shows the circuit of FIG. 1 in greater schematic detail.

As shown in greater detail in FIG. 3, the semiconductor multivibrator 14 preferably comprises a pair of grounded emitter NPN transistors 26 and 28 having collector terminals N' and TN (corresponding to the identically referenced terminals in FIG. 1) connected for energization from the voltage supply terminal V through current limiting collector resistors 30 and 32. The transistor collector terminals N' and TN are cross-connected with the transistor base terminals N and FN' through respective resistors 34 and 36 so as to provide for saturated bistable multivibrator operation.

When a pulse is applied at the "on" base terminal N, the transistor 26 becomes conductive and the transistor base terminal FN' is brought substantially to ground potential so as to make the transistor 28 nonconductive. The multivibrator 14 remains on while the transistor 26 remains conductive with drive current provided from the supply terminal V through the cross-connected resistor 36.

When a pulse is applied to the transistor base terminal FN', the transistor 28 becomes conductive and the transistor 26 becomes non-conductive in a manner similar to that described for the opposite switching condition. The multivibrator 14 is thus switched off while drive current for the transistor 28 is provided through the cross-connected resistor 34 from the voltage terminal V.

The multivibrator 16 is preferably identical with the multivibrator 14 and accordingly comprises a pair of NPN transistors 36 and 38 connected in a manner similar to that already described for the transistors in the multivibrator 14. To assure a proper vibratory mode of operation for the multivibrators 14 and 16, the starting circuit 22 is connected between the supply voltage terminal V and the on terminal N and the off terminal $F_1$, $N_1'$ of the multivibrators 14 and 16. To establish starting conditions, the circuit 22 includes a voltage dropping resistor 40 and a capacitor 42 in series with a current directing diode 44. A resistor 46 shunted across the capacitor 42 provides for discharging the capacitor 42 when the circuit 10 is shut off. As the capacitor 42 charges during the starting period, the circuit 22 provides a current pulse to the terminals N and $F_1N_1'$ thereby to switch the multivibrator 14 on and the multivibrator 16 off.

With continued reference to the schematic of FIG. 3, the timing circuit 18 comprises a timing branch 48 including a timing resistor 50 and a timing capacitor 52 connected to be energized by the multivibrator terminal TN when the multivibrator 14 is on. A unijunction transistor 54 has one of its base terminals connected through a resistor 56 for energization from the multivibrator terminal TN. A coupling resistor 58 is connected from the other unijunction transistor base terminal to common or ground potential. The unijunction transistor emitter terminal is connected to a junction 60 between the timing resistor 50 and the timing capacitor 52.

When potential is applied across the timing branch 48, voltage rises across the capacitor 52 until the PN junction in the unijunction transistor 54 becomes forward biased. The unijunction transistor 54 is then sharply fired and the capacitor 52 discharges through the unijunction transistor emitter and the coupling resistor 58.

A current directing circuit 62 having branches 63 and 64 couples the voltage pulse across the resistor 58 to the off terminal FN' of the multivibrator 14 and to the on terminal $N_1$ of the multivibrator 16. A semiconductor diode 66 provides for the pulse coupling while preventing reverse current flow to the timing circuit 18. Current dividing resistors 68 and 70 are provided in the current directing circuit branches 63 and 64 so as to provide appropriate and preferably substantially equal current pulse distribution for simultaneously switching the multivibrators 14 and 16 through the terminals FN' and $N_1$.

When the multivibrator 16 is switched on, the timing circuit 20 is energized from the terminal $T_1N_1$. A unijunction transistor 72 and a timing branch 74 including a timing resistor 76 and a timing capacitor 78 are interconnected in the timing circuit 20 in a manner similar to that described for the corresponding components in the timing circuit 18. The unijunction transistor 72 is fired a predetermined time after the multivibrator 16 is turned on, and the resulting sharp voltage pulse across a unijunction transistor base resistor 80 is coupled to the on terminal N of the multivibrator 14 and the off terminal $F_1N_1'$ of the multivibrator 16. The multivibrator switching pulse is again transmitted through a current directing circuit 82 having branches 84 and 86 connected to the multivibrator terminals N and $F_1N_1'$. A diode 88 in the circuit 82 and current dividing resistors 90 and 92 operate in a manner similar to that described for the corresponding components in the current directing circuit 62.

The multivibrator 14 is thus reswitched to its on state and the multivibrator 16 is reswitched to its off state after operation of the timing circuit 20, and a new cycle of operation is then begun. The circuit 10 continues to operate cyclically as long as voltage is applied to the supply terminal V.

Output pulses are generated by the output switching means 24 in response to the cyclical pulsing operation of the multivibrators 14 and 16. In this instance, the output switching means 24 includes an amplifying semiconductor switch or an NPN transistor 94 having its collector-emitter path connected in series with a coil 96 of a relay and the voltage supply terminal V. The relay is provided with a normally closed contact 98 connected between the output terminal SN and the voltage supply terminal V.

A diode 100 is reverse connected across the relay coil 96 to provide for transient inductance current discharge. The output transistor base is connected through a base resistor 102 to the multivibrator terminal N', and drive current is thus provided for the transistor 94 when the multivibrator 14 is off. When the transistor 94 is switched on by the drive current, it conducts current to energize the relay coil 96 and hold the relay contact 98 open.

When the multivibrator 14 is switched on, the transistor 94 is non-conductive and the relay contact 98 is closed. A voltage pulse thus appears at the output terminal SN when the multivibrator 14 is on and "no pulse" appears when the multivibrator 14 is off.

Preferably, the resistor 50 and the capacitor 52 in the timing circuit 18 are set to result in a relatively fast voltage rise on the timing capacitor 52 so as to produce a short on time for the multivibrator 14 and a short on time for the pulse train 25. Further, the timing resistor 76 and the timing capacitor 78 in the timing circuit 20 are preferably set to result in a relatively slow voltage rise on the timing capacitor 78 so as to produce a relatively long on time for the multivibrator 16 and correspondingly a relatively long off time for the multivibrator 14 and the pulse train 25.

In one sample circuit with the resistor 50 equal to 47,000 ohms and the capacitor 52 equal to 100 microfarads, the pulses 27 had a time duration of 4.5 seconds. In the same sample circuit, the resistor 76 had a value of 330,000 ohms and the capacitor 78 was equal to 100 microfarads so that the time between the output pulses 27 (i.e. the pulse train off time) was 54 seconds. In another sample circuit, the timing circuit 20 was modified with the resistor 76 equal to 40,000,000 ohms and the capacitor 78 equal to 10 microfarads. The time between the output pulses 27 then was about 8 minutes.

Figure 4:
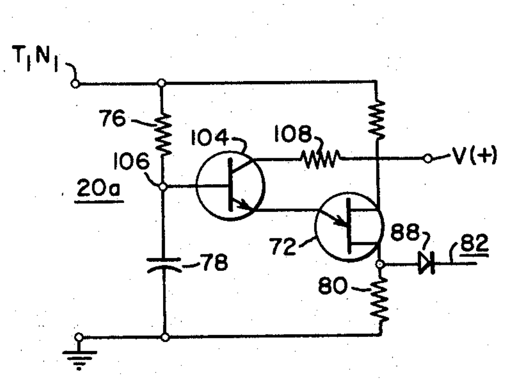
FIG. 4 shows a modified timing circuit for use in the circuitry of FIG. 3.

When it is desired to adjust the pulse train off time to relatively long time periods (such as the 8 minute off time sample just described), the resistance value for the resistor 76 in the timing circuit 20 is so great as to result in inadequate current for firing the unijunction transistor 72. In such cases, it is preferred that a timing circuit *20a* shown in FIG. 4 be employed. The timing circuit *20a* is similar to the timing circuit 20 and like reference characters have accordingly been employed for like elements. It differs from the timing circuit 20 through the employment of a transistor 104 operated essentially as an amplifier.

The base of the transistor 104 is connected to a junction 106 between the timing resistor 76 and the timing capacitor 78 and the transistor emitter is connected to the emitter of the unijunction transistor 72. Finally, the emitter-collector path of the transistor 104 is connected in series with a collector resistor 108 to the voltage supply terminal V. When the timing capacitor 78 is charged to the voltage associated with the relatively long time interval, the transistor 102 becomes conductive and the unijunction transistor 72 is fired so that collector emitter current from the transistor 104 and discharge current from the capacitor 78 flows through the coupling resistor 80 to switch the multivibrators 14 and 16 as previously described.

The pulse train 25 generated by the semiconductor multivibrator circuit 10 can thus be characterized by a wide variety of "on" and "off" times according to the setting of the timing circuits 18 and 20 or 20*a*. Further, for any given timing design for the circuit 10, circuit units from unit to unit of production can be readily adjusted to a standard timing operation if the various production units have differing circuit parameters otherwise resulting in variance from the standard timing operation. The circuit 10 is especially adapted to generating a pulse train having a short on time and a long off time, and the short time period can be short as 100 microseconds or less while the long time period can be as much as 10 minutes or more. Additionally, the semiconductor circuit 10 operates with stability since the level of supply voltage is not critical to proper circuit functioning. The multivibrator switching time is rapid and accordingly the output pulses have rapid rise and fall times.

Figure 5:
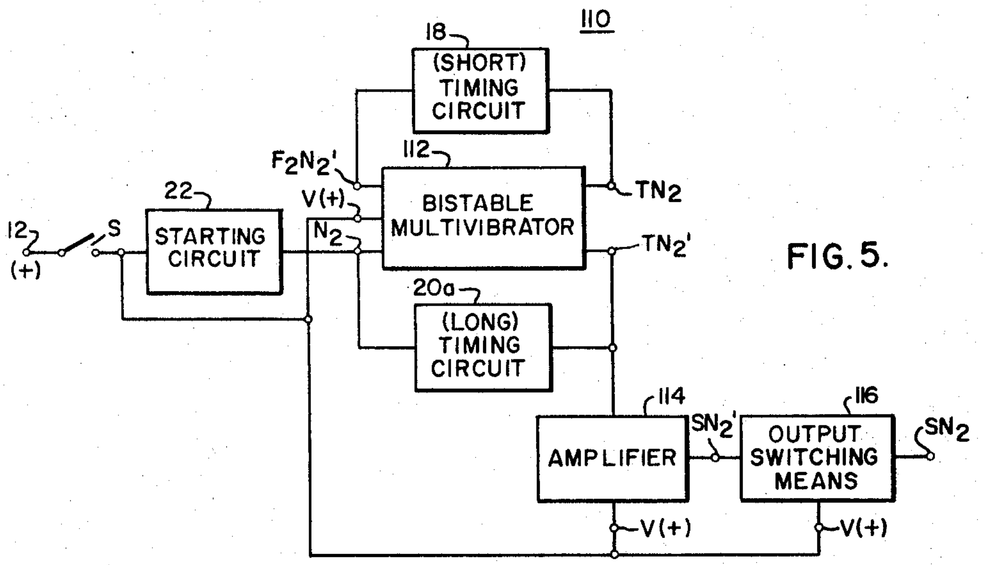
FIG. 5 shows a block diagram of another semiconductor multivibrator circuit arranged to generate a pulse train in accordance with the principles of the invention.

In FIG. 5, there is shown the preferred form of a semiconductor multivibrator pulse train generating circuit 110 arranged in accordance with the principles of the invention. It is similar to the circuit 10 but is generally more simply organized and specifically differs therefrom primarily through the provision of a single bistable multivibrator 112 which is switched between stable states by the timing circuit 18 and the timing circuit 20a. In addition, an amplifier 114 is connected between the multivibrator 112 and output switching means 116 because of comparatively increased loading placed on the multivibrator 112.

Figure 6:
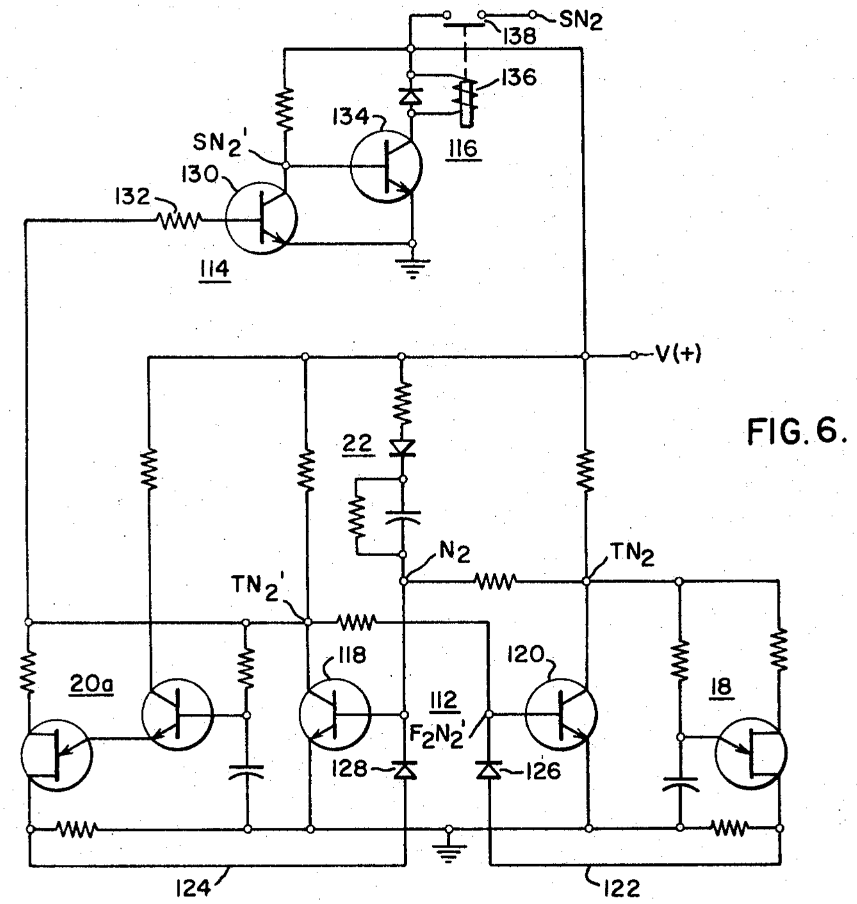
FIG. 6 shows the circuit of FIG. 5 in greater schematic detail.

As shown in schematic detail in FIG. 6, the multivibrator 112 is identical with the previously described multivibrators and accordingly is provided with a pair of NPN transistors 118 and 120 and "on" and "off" terminals $N_2$ and $F_2N_2'$ respectively. The timing circuit 18 is energized from transistor collector terminal $TN_2$ when the multivibrator 112 is "on" and the timing circuit 20*a* is energized from transistor collector terminal $TN_2'$ when the multivibrator 112 is off.

To provide for a relatively short on time for the multivibrator 112, and for the pulse train 25, the timing circuit 18 is set to produce a pulse through a current directing circuit 122 to the multivibrator off terminal $F_2N_2'$ (the base terminal of the transistor 120) after a relatively short period of operating time. Similarly, the timing circuit 20*a* is set to produce a pulse through a current directing 124 to the multivibrator on terminal $N_2$ (the base terminal of the transistor 118) after a relatively long period of time so as to produce a relatively long multivibrator and pulse train off time. Semiconductor diodes 126 and 128 are employed in the current directing circuits 122 and 124, and the current dividing or equalizing resistors employed in the circuit 10 are eliminated in this instance since each of the circuits 122 or 124 is singly loaded.

When the multivibrator 112 is on, that is when the terminal $TN_2'$ is at a relatively low potential or at ground potential because of the conductive state of the transistor 118, a transistor 130 in the output amplifier 114 is nonconductive since drive current through a base resistor 132 is withheld. An output transistor 134 in the output switching means 116 is then conductive since its base circuit is connected to a collector terminal $SN_2'$ which is then at a relatively high potential. Collector emitter current through the output switching transistor 134 flows through a coil 136 of an output relay having a normally open contact 138. The contact 138 is thus closed and a pulse is provided at an output terminal $SN_2$.

Accordingly, a pulse is produced at the output terminal $SN_2$ each time the multivibrator 112 is on, i.e. each time the transistor 118 is conductive, and "no pulse" is produced at the output terminal $SN_2$ each time the multivibrator 112 is off. The pulse train 25 described in connection with the circuit 10 is thus also generated by the circuit 112 with similar advantages and operating features.

The foregoing description has been presented only to illustrate the principles of the invention. Accordingly, it is desired that the invention be not limited by the embodiments described, but, rather that it be accorded an interpretation consistent with the scope and spirit of its broad principles.

What is claimed is:

1. A pulse train generating circuit arrangement energizable by a suitable D.C. source, said circuit arrangement comprising a first semiconductor bistable multivibrator circuit energized by the D.C. source, a unijunction transistor and an R.C. timing branch connected to form a timing circuit, means for connecting an input of the timing circuit to be energized by said first multivibrator circuit when said first multivibrator circuit is switched into one of its two stable states, a second semiconductor multivibrator bistable circuit energized by the D.C. source, circuit means for directing an output from the timing circuit to switch said first multivibrator circuit into its other stable state and to switch said second multivibrator circuit into one of its two stable states after the timing circuit has been energized for a first time period, another unijunction transistor and another R.C. timing branch connected to form another timing circuit, means for connecting an input of the other timing circuit to be energized by said second multivibrator circuit when said second multivibrator circuit is switched into its one stable state, circuit means for directing an output of the other timing circuit to switch said first multivibrator circuit into its one stable state and to switch said second multivibrator circuit into its other stable state after the other timing circuit has been energized for a second time period, and means connected to one of said multivibrator circuits so as to produce successive output pulses each having a time duration substantially equal to one of the two time periods.

2. A pulse train generating circuit arrangement energizable by a suitable D.C. source, said circuit arrangement comprising a first semiconductor bistable multivibrator circuit energized by the D.C. source, a unijunction transistor and an R.C. timing branch connected to form a timing circuit, means for connecting an input of the timing circuit to be energized by said first multivibrator circuit when said first multivibrator circuit is switched into one of its two stable states, a second semiconductor multivibrator bistable circuit energized by the D.C. source, circuit means for directing an output from the timing circuit to switch said first multivibrator circuit into its other stable state and to switch said second multivibrator circuit into one of its two stable states after the timing circuit has been energized for a first time period, another unijunction transistor and another R.C. timing branch connected to form another timing circuit, means for connecting an input of the other timing circuit to be energized by said second multivibrator circuit when said second multivibrator circuit is switched into its one stable state, circuit means for directing an output of the other timing circuit to switch said first multivibrator circuit into its one stable state and to switch said second multivibrator circuit into its other stable state after the other timing circuit has been energized for a second time period, equalizing resistance means connected in each of said directing circuit means so as to assure simultaneous switching of said multivibrator circuits, and means connected to one of said multivibrator circuits so as to produce successive output pulses each having a time duration substantially equal to one of the two time periods.

3. A pulse train generating circuit arrangement energizable by a suitable D.C. source, said circuit arrangement comprising a first semiconductor bistable multivibrator circuit energized by the D.C. source, a unijunction transistor and an R.C. timing branch connected to form a timing circuit, means for connecting an input of the timing circuit to be energized by said first multivibrator circuit when said first multivibrator circuit is switched into one of its two stable states, a second semiconductor multivibrator bistable circuit energized by the D.C. source, circuit means for directing an output from the timing circuit to switch said first multivibrator circuit into its other stable state and to switch said second multivibrator circuit into one of its two stable states after the timing circuit has been energized for a first time period, another unijunction transistor and another R.C. timing branch connected to form another timing circuit, means for connecting an input of the other timing circuit to be energized by said second multivibrator circuit when said second multivibrator circuit is switched into its one stable state, circuit means for directing an output of the other timing circuit to switch said first multivibrator circuit into its one stable state and to switch said second multivibrator circuit into its other stable state after the other timing circuit has been energized for a second time period, the first mentioned R.C. timing branch including a relatively large resistance resistor and the other R.C. timing branch including a relatively small resistance resistor so as to make the associated time periods long and short respectively, amplifier means connected between the first mentioned R.C. timing branch and the associated unijunction transistor, and means connected to one of said multivibrator circuits so as to produce successive output pulses each having a time duration substantially equal to one of the two time periods.

4. A pulse train generating circuit arrangement as set forth in claim 3 wherein each multivibrator circuit comprises a pair of grounded emitter transistors having base and collector terminals, resistance means cross couple said base and collector terminals, and said directing circuit means are respectively connected to said transistor base terminals.

5. A pulse train generating circuit arrangement as set forth in claim 4 wherein an R.C. starting circuit is connected from the source to one of said directing circuit means.

6. A pulse train generating circuit arrangement as set forth in claim 5 wherein a diode and a current dividing resistor is connected in each of said directing circuit means.

7. A pulse train generating circuit arrangement energizable by a suitable D.C. source, said circuit arrangement comprising a semiconductor bistable multivibrator circuit energized by the D.C. source, an R.C. timing branch having a relatively low valued resistor, a unijunction transistor connected with said R.C. timing branch to form a timing circuit, means for energizing an input of the timing circuit from said multivibrator circuit when said multivibrator circuit is switched into one of its two stable states, circuit means for directing an output from the timing circuit to switch said multivibrator circuit into its other stable state after the timing circuit has been energized for a relatively short time period, another R.C. timing branch having a relatively large valued resistor, another unijunction transistor connected with said other R.C. timing branch to form another timing circuit, means for energizing an input of the other timing circuit from said multivibrator circuit when said multivibrator circuit is switched into its other stable state, circuit means for directing an output from the other timing circuit to switch said multivibrator circuit into its one stable state after the other timing circuit has been energized for a relatively long time period, amplifier means interconnecting said other R.C. timing branch and said other unijunction transistor, and means connected to said multivibrator circuit so as to produce successive output pulses each having a time duration substantially equal to one of the two time periods.

References Cited

UNITED STATES PATENTS

| | | | |
|---|---|---|---|
| 2,997,665 | 8/1961 | Sylvan | 331—113 |
| 3,135,877 | 6/1964 | Fischman | 307—88.5 |
| 3,259,854 | 7/1966 | Marcus et al. | 331—111 |

JOHN S. HEYMAN, *Primary Examiner.*

ARTHUR GAUSS, *Examiner.*

J. ZAZWORSKY, *Assistant Examiner.*